United States Patent [19]
Flory et al.

[11] Patent Number: 6,060,724
[45] Date of Patent: May 9, 2000

[54] QUANTUM WIRE LOGIC GATE

[75] Inventors: Curt A. Flory, Los Altos; R. Stanley Williams, Mountain View, both of Calif.

[73] Assignee: Hewlett-Packard Company, Palo Alto, Calif.

[21] Appl. No.: 09/228,214

[22] Filed: Jan. 11, 1999

Related U.S. Application Data

[62] Division of application No. 08/959,887, Oct. 29, 1997, Pat. No. 5,903,010.

[51] Int. Cl.$^7$ .............................. H01L 45/00; H01L 29/08
[52] U.S. Cl. ................................. 257/24; 257/23; 257/27; 326/104; 326/136
[58] Field of Search .................................. 257/17, 23–24, 257/26–27, 29; 326/104, 136

[56] References Cited

U.S. PATENT DOCUMENTS

| | | | |
|---|---|---|---|
| 4,550,330 | 10/1985 | Fowler | 257/24 |
| 4,942,437 | 7/1990 | Folwler et al. | 257/26 |
| 5,233,205 | 8/1993 | Usagawa et al. | 257/23 |
| 5,453,627 | 9/1995 | Aihara et al. | 257/24 |
| 5,497,015 | 3/1996 | Ishibashi et al. | 257/287 |
| 5,640,022 | 6/1997 | Inai | 257/26 |

*Primary Examiner*—John Guay
*Attorney, Agent, or Firm*—Marc Mayer

[57] ABSTRACT

A quantum wire switch and a switching method for switching charge carriers between a first output and a second output utilizing quantum interference of the charge carriers. A quantum switch includes a quantum wire extending from an input to a first output, a second quantum wire extending from the input to a second output, and a third quantum wire extending between the first and second outputs, the three quantum wires together defining a ring. A controllable-length quantum wire electron stub tuner is connected to the ring. As charge carriers propagate from the input around the ring the stub tuner is used to control the quantum interference of the charge carriers resulting in local maxima and minima at various points around the ring. Setting the stub to a first length results in a local maximum at the first output and a local minimum at the second output, and the charge carriers can propagate to the first output and not the second output. Setting the stub to a second length reverses the locations of the local maxima and minima, and the charge carriers propagate to the second output but not the first output. The invention can also include a second controllable-length stub attached to the ring to increase switching efficiency. A quantum switch according to the invention can also act as a simple binary NOT logic gate or a simple binary AND logic gate.

7 Claims, 13 Drawing Sheets

QUANTUM WIRE LOGIC GATE

CROSS REFERENCE TO RELATED APPLICATION(S)

This is a divisional of application Ser. No. 08/959,887 filed on Oct. 29, 1997 now U.S. Pat. No. 5,903,010.

BACKGROUND OF THE INVENTION

The present invention relates generally to electrical conductors and switches and more particularly to a quantum wire logic gate.

Many kinds of electrical wires and switches are in widespread use in applications ranging from industrial motor controls to ordinary house wiring to high-speed solid state logic in microcomputers. A wire that carries current for a given electrical device must be physically large enough to carry the quantity of current required by the device without overheating. To minimize cost and physical bulk, wires and switches should be no larger than needed. The constraint of making wires and switches big enough to perform their functions and as small as possible to minimize size and cost is particularly critical in microprocessor fabrication because a very large number of wires and switches must fit into a very small space.

Innovations in semiconductor design and semiconductor manufacture have led to methods of making very tiny transistor switches that require extremely small amounts of electrical current. This has made it possible to shrink the size of the conductors that carry the current to and from the transistors to such an extent that millions of transistors and conductors can now fit into a semiconductor chip one or two centimeters square.

An electric current can be defined as a flow of charge carriers through a conductor. Countless millions of charge carriers can fit on a cross-sectional slice of a typical conductor such as house wiring, and even at the small dimensions found in today's integrated circuits many charge carriers can fit across one conductor.

Every physical object, including each of these charge carriers, has a wave nature associated with it. This means that in some respects the object behaves as if it were a particle and in other respects the object behaves as if it were a wave. The particle behavior is dominant in any object where the wavelength associated with the object, called the de Broglie wavelength, is much smaller than the other characteristic dimensions of the physical system in which the object is present. For all practical purposes, this means that an object large enough to be seen with the human eye will behave like a particle rather than like a wave. Newton's laws of motion describe the particle behavior of these objects.

In objects operating in systems that have characteristic dimensions approaching the size of the de Broglie wavelength of the object, the particle behavior is not dominant and the wave behavior becomes important. Newton's laws do not describe the wave behavior of objects; instead, one must have recourse to the principles of quantum mechanics.

Quantum mechanics is the study of systems that approach the size of the de Broglie wavelength where the wave nature of particles becomes dominant. The de Broglie wavelength associated with a charge carrier in a semiconductor such as gallium arsenide is of the order of ten nanometers (one nanometer is $10^{-9}$ meters). If the conductor in which such a charge carrier is moving has a cross-section only slightly larger than the de Broglie wavelength of the particle, the wave behavior of the charge carrier will become dominant and will correctly predict what will happen to the charge carrier as it moves through the conductor. One aspect of the wave behavior of objects is the occurrence of quantum interference effects.

Quantum interference effects are similar to interference effects observed in optical systems, such as interferometers and reflection gratings, but occur only for much smaller physical systems. The developing capability of fabricating smaller and smaller conductors has allowed researchers to begin to investigate electrical devices whose operational characteristics are dependent upon the quantum interference effects of charge carriers.

Much recent activity has centered on structures called "quantum wires". These structures are long thin channels which confine charge carriers within a region of maximum transverse dimension comparable to the de Broglie wavelength of those charge carriers. These quantum wires can act as fermionic waveguides, in direct analogy to electromagnetic waveguides. In order for the propagating modes of the quantum wire to maintain their quantum wave coherence along the length of the structure, it is necessary that the carriers enjoy "ballistic transport". This means the carriers must not undergo decohering inelastic scattering events as they propagate through the structure. Due to improvements in achievable materials characteristics, simple quantum wire structures have been fabricated and tested, as reported, for example, by Ismail, Bagwell, Orlando, Antoniadis and Smith in the *Proceedings of the IEEE*, volume 79, page 1106 (1991).

A means of controlling the conductance properties of the channel has been implemented by making a channel with a variable length stub of quantum wire attached in the transverse dimension. The conductance of the channel is affected by reflected standing waves which are established in the stub. These standing waves interfere with the channel wave function. The interference effects are dependent upon the de Broglie wavelength of the carriers and the length of the stub. If the channel and stub are fabricated as, for example, gallium arsenide (GaAs) channels in an aluminum gallium arsenide (AlGaAs) substrate, the length of the stub can be controlled by a bias voltage which varies a depletion region that determines the stub termination point. This simple structure has been called an "electron stub tuner" or "quantum stub tuner" and was independently proposed by Sols, Macucci, Ravaioli Hess, *Applied Physics Letters*, vol. 54 page 350 (1989) and vol. 66 page 3892 (1989), and by Fowler in U.S. Pat. No. 4,550,330, issued Oct. 29, 1985.

The conductance of the channel in an electron stub tuner is expected to be a periodic function of the stub length, and this is borne out by data descriptive of actual electron stub tuners (see Aihara, Yamamoto and Mizutani, *International Electronic Devices Meeting*, 1992).

The electron stub tuner and other possible quantum wire structures can be theoretically analyzed using a simple model wherein the wire channels are assumed to have negligible transverse spatial extent. This allows analysis of the structure by solving the one-dimensional Schrodinger's equation on a thin-wire network wherein the wavefunctions and boundary conditions are well-defined, as described in Ruedenberg and Scherr, *Journal of Chemical Physics*, vol. 21, page 1565 (1953).

If quantum wire structures of more complicated topologies than the electron stub tuner could be developed, it would be possible to create an entirely new class of electronic devices that would offer significant advantages over conventional devices in terms of smaller size, higher speed, and lower power consumption. Accordingly, it will be apparent that there is a need for quantum wire devices having more capabilities than the electron stub tuner.

SUMMARY OF THE INVENTION

The present invention provides a fundamental electronic circuit device—a switch—implemented in a quantum wire structure. The switch offers the higher speed and lower power consumption that will be required in computers and other appliances of the future.

Briefly and in general terms, in a switch according to the invention a quantum wire extends from an input to a first node and a second quantum wire extends from the input to a second node. A third quantum wire extends between the first and second nodes, the three quantum wires together defining a ring. A controllable-length quantum wire stub is connected to the first quantum wire. Charge carriers propagate from the input around the ring. Quantum interference results in local maxima and minima at various points around the ring. Setting the stub to a first length results in a local maximum at the first node and a local minimum at the second node. Thus the charge carriers can propagate to an output at the first node but not to an output at the second node. Setting the stub to a second length changes the locations of the local maxima and minima, and the charge carriers can propagate to the output at the second node but not the output at the first node.

In one embodiment a second controllable-length stub is connected to the first quantum wire spaced apart from the first stub. Simultaneously setting both stubs to a common length results in cleaner switching.

In addition, a simple binary NOT logic gate is implemented by applying a fixed input of electrical charge carriers to the input port of the switch as described above and structuring the control of the stub such that a logical ZERO sets the length of the stub to the first length and a logical ONE sets it to the second length. Taking the output from the first node with the sense that the presence of the electrical charge carriers is a logical ONE results in a logical ONE output when a logical ZERO is applied to control the stub, and vice versa.

Similarly, a simple binary AND logic gate is implemented such that a first logical ONE input applies a fixed input of electrical charge carriers to the input port of the switch as described above, and a first logical ZERO input removed the fixed input of electrical charge carriers from the input port of the switch. Further, control of the stub is structured such that a second logical ZERO input sets the length of the stub to the first length and a second logical ONE input sets it to the second length. Taking the output from the first node with the sense that the presence of the electrical charge carriers is a logical ONE results in a logical ONE output only when a first logical ONE is applied to the input port and a second logical ONE is applied to the control stub.

A method of switching an electric current according to the invention includes causing a current of electric charge carriers to propagate between first and second nodes on a conductor. In response to a first value of a control input, an interference is generated such that the magnitude of the current is minimized at the first node and maximized at the second node. Similarly, in response to a second value of the control input, an interference is generated such that the magnitude of the current is minimized at the second node and maximized at the first node.

Other aspects and advantages of the present invention will become apparent from the following detailed description, taken in conjunction with the accompanying drawings, illustrating by way of example the principles of the invention.

DESCRIPTION OF THE PREFERRED EMBODIMENT

Figure 1A:
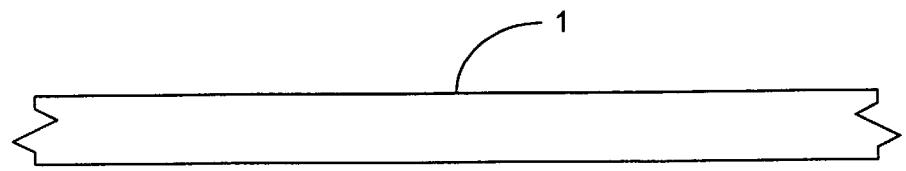
FIG. 1A is a schematic view of a straight quantum wire segment as known in the prior art.

As shown in the drawings for purposes of illustration, the invention is embodied in a novel electrical switch and a switching method based upon quantum wire components. The switch controls the conductance between an input and a pair of outputs by varying the wavefunction phase shift around a quantum wire ring connecting the external nodes. The phase shift is controlled using an electron stub tuner.

The invention is based upon the concept that scaling of structures down to dimensions smaller than the elastic and inelastic mean free paths of the charge carriers causes the carrier transport to become ballistic. For such systems, the quantum mechanical wave nature of the charge carriers becomes manifest. This allows new device topologies that can exploit the quantum mechanical wave nature of the charge carriers to generate useful device functionality.

The quantum switch according to the invention is smaller, faster, and requires far less electrical current to operate than transistor switches in use today. These properties make the switch according to the invention ideal for use in microprocessors and other integrated circuits. The smaller size means that more of the switches can be formed in a given area of substrate than would be possible with transistors. Lower current usage means that less heat is generated by circuits utilizing the switches according to the invention than a comparable transistor-based circuit. Finally, the faster switching speed means that switch-based circuits will operate with more speed than is possible with comparable transistor-based circuits.

Figure 1B:
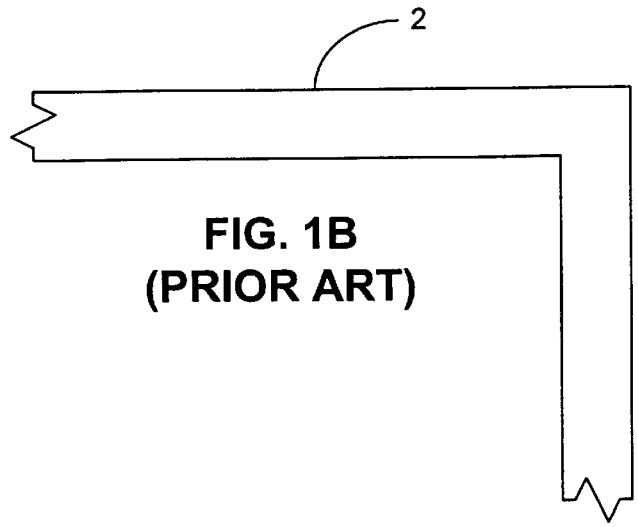
FIG. 1B is a schematic view of a quantum wire segment including a 90 degree bend as known in the prior art.
Figure 1C:
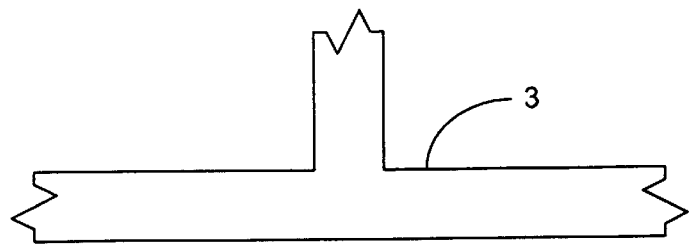
FIG. 1C is a schematic view of a quantum wire junction as known in the prior art.
Figure 1D:
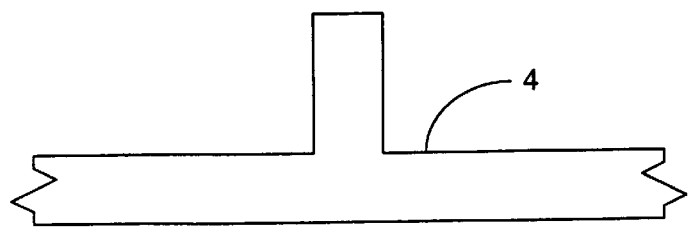
FIG. 1D is a schematic view of a quantum wire stub tuner as known in the prior art.

FIGS. 1A, 1B, 1C and 1D depict components that have previously been scaled down to such a point that the quantum mechanical wave nature of the charge carriers has become manifest. FIG. 1A, depicts a straight quantum wire segment 1. FIG. 1B depicts a quantum wire having right-angle wire bend 2. FIG. 1C depicts a quantum wire junction 3 in which one end of a first quantum wire is joined to a second quantum wire such that the angle between the first and second quantum wires forms a right angle. FIG. 1D depicts an electron stub tuner 4 consisting of a segment of quantum wire which has a lateral quantum wire stub attached.

These component have been fabricated from gallium arsenide (GaAs) channels in an aluminum gallium arsenide (AlGaAs) substrate. The charge carriers are confined in the GaAs channels because GaAs has a lower bandgap than the AlGaAs substrate surrounding the channels. Similarly, the components can be fabricated as semiconductor channels in many semiconductor substrates, as long as the difference in the bandgap between the channel and the substrate is sufficiently large. The quantum components can also be fabricated from elemental metal or metallic wires formed on a semiconductor or an insulator substrate, for example aluminum wires formed on a silicon substrate. Further, the quantum components can be fabricated from conjugated polyenes and other conducting polymers. Additionally, the quantum components can be fabricated from carbon nanotubes.

Figure 2:
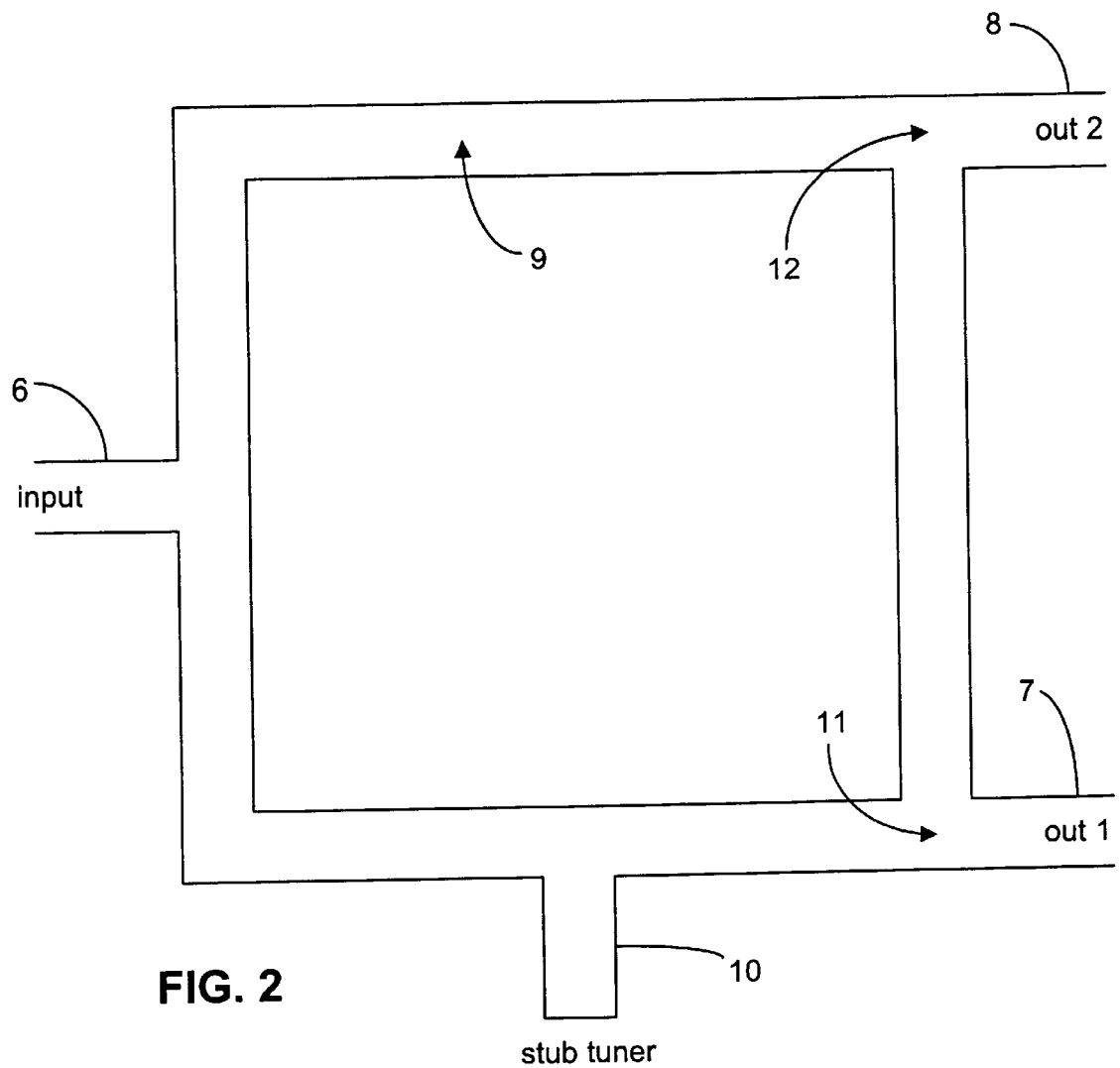
FIG. 2 is a schematic view depicting the structural topology of a single stub quantum switch according to the invention.

FIG. 2 depicts the structure of one preferred embodiment of the quantum switch 5 according to the invention. The switch consists of an input quantum wire 6 connected to a pair of output quantum wires 7, 8 by a quantum wire ring 9, with an attached electron stub tuner 10 on a segment of the ring. The switch 5 allows the conductance between the input line 6 and the output lines 7, 8 to be controlled with an external switching voltage applied to the electron stub tuner 10. The charge carrier current incident on the input line has two paths, one in each direction around the ring, to the nodes 11, 12 of the output lines.

The width of the conductors that constitute the quantum wire ring 9 approaches the de Broglie wavelength of the carries so the quantum wave nature of the carriers becomes dominant. As a result, the movement of the carriers around the quantum wire ring 9 is wavelike. A single carrier can thus propagate in either direction (clockwise path and counter-clockwise path) around the ring, and can actually propagate in both directions simultaneously. Because waves are propagating in both directions, the phase of the quantum wavefunction along the two paths can cause constructive or destructive interference at various points around the ring.

By properly choosing quantum wire lengths and using carriers of a known energy, the location of the maximum constructive interference can be made to coincide with the first output node 11, while a location of the maximum destructive interference can be made to coincide with the second output node 12. By changing the effective length of the electron stub tuner 10, the locations of the maximum constructive and destructive interference can be changed. If a proper electron stub tuner effective length is chosen, the location of the maximum constructive interference can be made to coincide with the second output node 12, while a location of the maximum destructive interference can be made to coincide with the first output node 11. Thus, a condition can be made to arise where an incident carrier on the input line 6 has roughly unit scattering probability to one of the output lines, and zero probability to the other.

The operation of the quantum wire switch according to the invention requires mathematical analysis of each of the quantum wire components 1, 2, 3, 4 shown in FIGS. 1A, 1B, 1C, and 1D, respectively. The operation of these quantum wire components can be understood by analogy to guided wave phenomena in microwave and optical devices. For example, in the electron stub tuner 4, if the width of the quantum wires is adequately narrow, only the lowest transverse mode of the carriers in the conduction channel propagate. The electron stub tuner channel conductance is a periodic function of the stub length, varying between zero (0) and one (1) in units of $2e^2/\hbar$, where e is the electron charge and $\hbar$ is Planck's constant, due to the interference between the carrier waves propagating in the quantum wire and those reflected in the stub region. The length of the stub can be controlled, for example, by applying a gate voltage which varies a semiconductor depletion region defining the end of the stub.

When more complicated device topologies, such as a quantum switch according to the invention, are constructed using quantum wire components, analysis of these topologies must include the contributions from multiple transverse mode excitations, even for carrier energies only slightly above the lowest propagation mode cutoff. The reason for this is the relatively strong scattering effects that occur at wire junctions, and the attendant strong resonant interfering waves established between individual components. Furthermore, it is well known that wire junctions and even simple wire bends support localized bound states just below the lowest propagation mode cutoff. Both of these effects require a multiple mode treatment in the analysis of these quantum wire structures.

Figure 3:
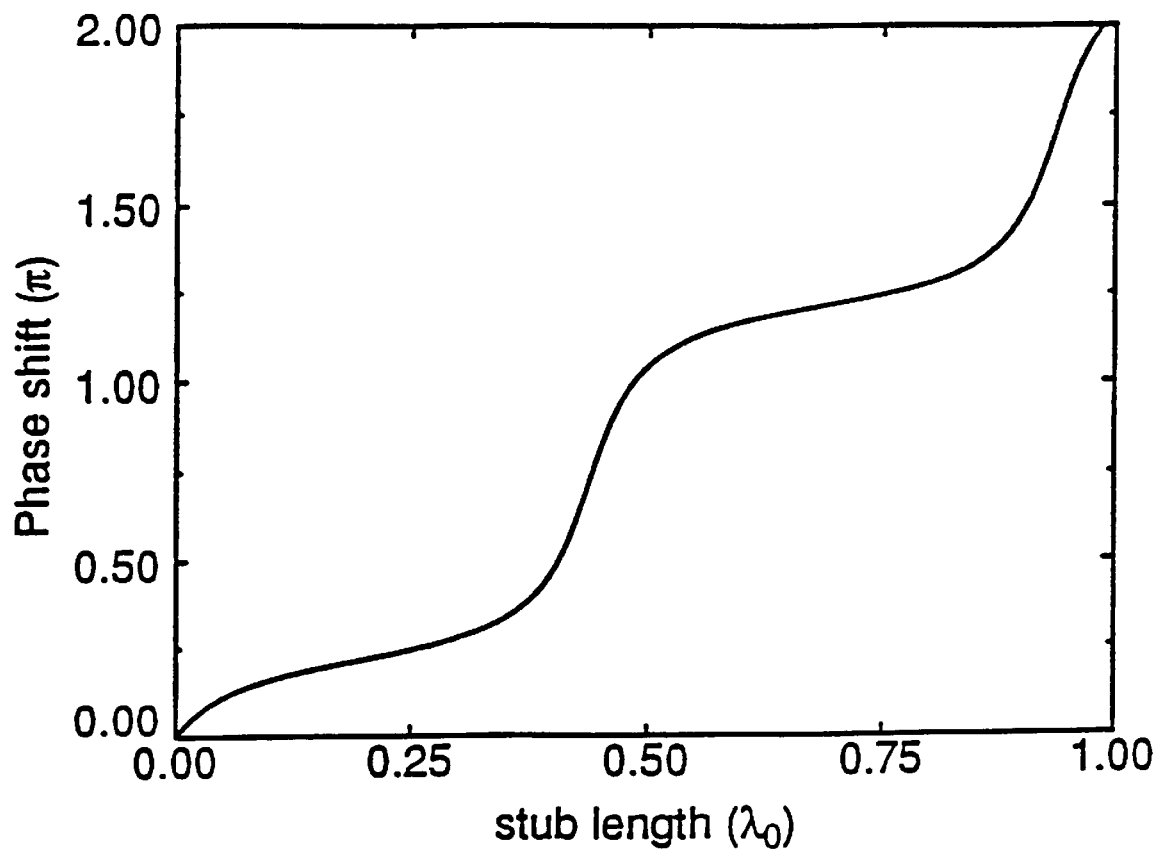
FIG. 3 is a graph depicting transmission phase shift as a function of stub length for an electron stub tuner as shown in FIG. 1D with an incident carrier energy of 1.5 times the cutoff energy of the lowest propagating mode.
Figure 4:
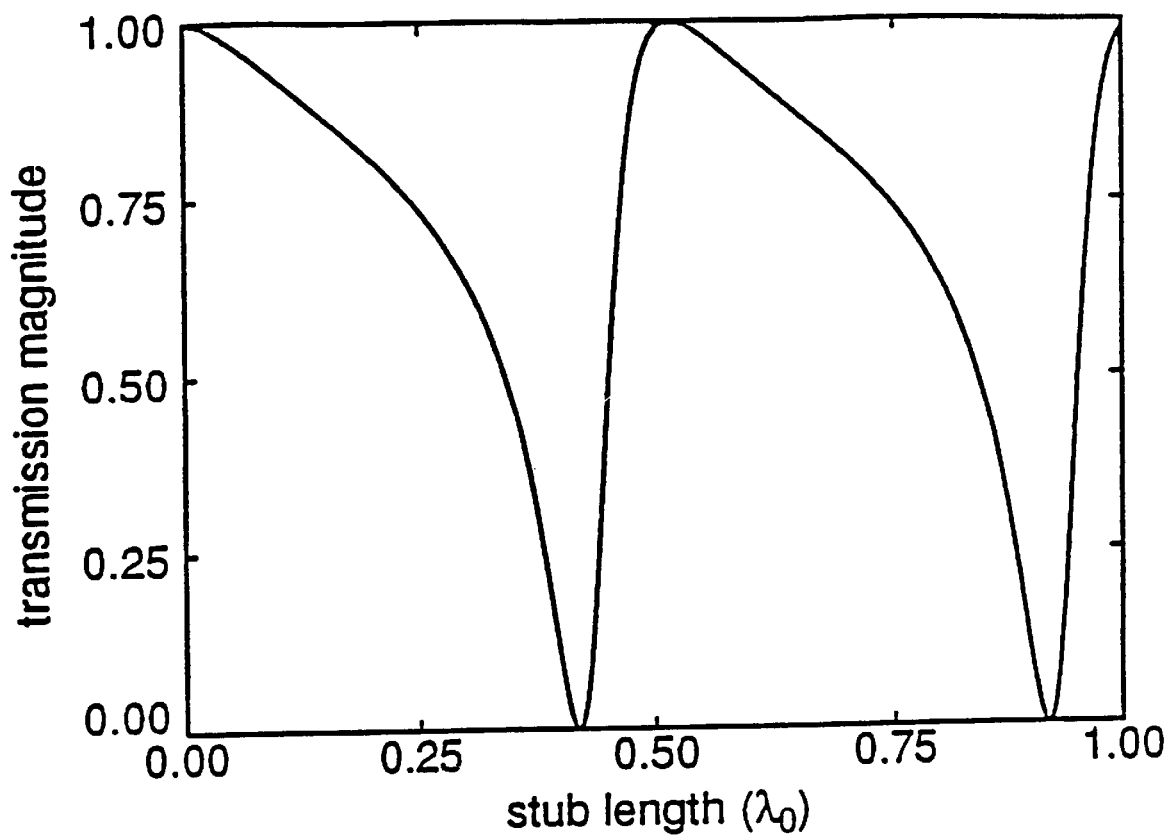
FIG. 4 is a graph depicting transmission magnitude as a function of stub length for an electron stub tuner with an incident carrier energy of 1.5 times the cutoff energy of the lowest propagating mode.

As discussed above with reference to FIG. 2, the phase of the quantum wavefunction along the two paths (clockwise and counterclockwise) around the wire ring 9 can cause constructive or destructive interference at the two output nodes 11, 12. For a proper choice of quantum wire lengths, and a given carrier energy, a condition arises where an incident carrier on the input line 6 has roughly unit scattering probability to one of the output lines, and zero probability to the other. This transmission probability can be related to the carrier conductance by the quantum unit of conductance, $\frac{2e^2}{\hbar}$ Switching of the conductance from one output line to the other is possible using the electron stub tuner 10 attached to the ring 9. The stub tuner has a transmission characteristic which is a periodic function of its length. Both the quantum wavefunction transmission magnitude and phase exhibit this periodic behavior. FIG. 3 is a plot of the transmission phase shift of an electron stub tuner for an incident carrier of energy 1.5 times the cutoff energy of the lowest propagating mode. The length of the electron stub tuner 10 is shown on the x-axis in units of wavelength ($\lambda_0$), and the transmission phase shift is shown on the y-axis in units of $\pi$. FIG. 4 is a plot of the transmission magnitude of an electron stub tuner for an incident carrier of energy 1.5 times the cutoff energy of the lowest propagating mode. The length of the electron stub tuner 10 is shown on the x-axis in units of wavelength ($\lambda_0$), and the transmission magnitude is shown on the y-axis.

This periodic behavior allows the stub tuner to be used as an effective phase shifter for the quantum wavefunction on one branch of the structure of FIG. 2. Thus, by changing the effective length of the stub tuner, the quantum interference around the ring structure can be changed, allowing the carrier conductance to be switched from one output line to the other.

To solve for the quantum wavefunction over the entire structure of the quantum switch 5 a mode matching technique is employed. Thus, the wavefunction in all straight wire segments is given as an expansion in a complete set of guided modes. The coefficients of the expansions in adjacent straight segments are linearly related to one another by demanding that the wavefunction and its first spatial derivative be continuous across the proximal connection region. The connection formulas for each of the quantum components 1, 2, 3, 4 are detailed below. For these formulas, it is assumed that the carriers are governed by the time-independent Schrodinger wave equation in the effective mass approximation for the regions interior to the quantum wire components. The wavefunction is constrained to be zero at the boundary edges of the conduction channels (hard wall approximation). It is also assumed that the physical third dimensions of the quantum components 1, 2, 3, 4 (into the page in FIGS. 1A, 1B, 1C and 1D) are much smaller than all other dimensions. This, coupled with the fact that all wire structural discontinuities lie in the plane of the page, allows the quantum states of the carriers to be described by the eigenvalues for propagation in the longitudinal and a single transverse dimension.

For the straight quantum wire segment 1 shown in FIG. 1, the dynamics of the carriers interior to the segment are governed by the time-independent Schrodinger equation with uniform potential, taken with no loss of generality to be zero $$-\frac{\hbar^2}{2m}\nabla^2 \Psi = E\Psi, \quad (1)$$

where E is the energy of the charge carrier having amplitude (magnitude and phase shift) $\Psi$ and m is the value of the guided mode of the charge carrier wavefunction. The general solution for the guided modes in these straight segments can be written as an infinite sum over the complete set of guided modes $$\Psi_i(x, y) = \sum_{m=0}^{\infty} (A_{im} e^{i\alpha_m x} + B_{im} e^{-i\alpha_m x}) \sqrt{\frac{2}{d}} \sin\left(\frac{m\pi y}{d}\right). \quad (2)$$

where x and y are the directions along and transverse to the wire propagation direction respectively, the subscript i identifies the particular wire segment, d is the lateral width of the wire, and the longitudinal wavevector $\alpha_m$ is given by $$\alpha_m = \sqrt{\frac{2mE}{\hbar^2} - \left(\frac{m\pi}{d}\right)^2}. \quad (3)$$

The longitudinal wavevector, $\alpha_m$, is real for open propagation channels and imaginary for closed propagation channels.

Figure 5:
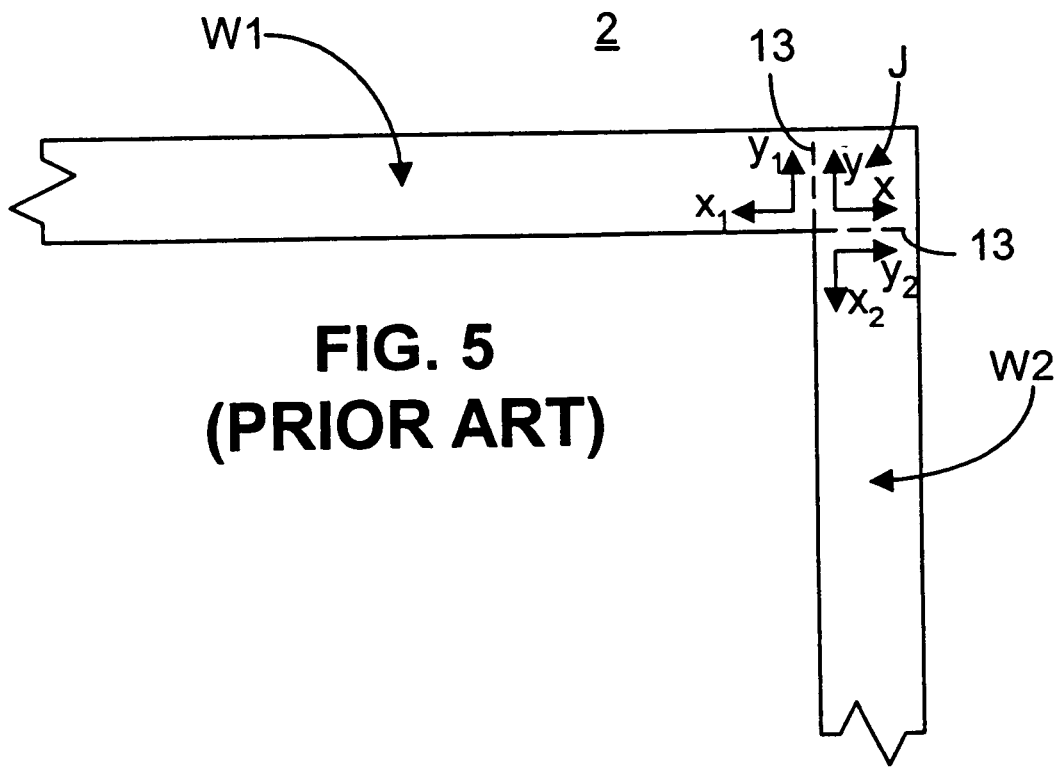
FIG. 5 is similar to FIG. 1B showing partitioning of the quantum wire bend into three distinct physical regions for mode matching purposes.

For analysis purposes, the quantum wire bend 2 can be broken up into three distinct regions as shown in FIG. 5. The three regions include two straight wire segments W1 and W2 and a bend junction region J that connects the two straight wire segments. The two straight wire segments W1 and W2 have wavefunction solutions given by $$\Psi_{1,2}(x_{1,2}, y_{1,2}) = \sum_{m=0}^{\infty} (A_{1,2m} e^{i\alpha_m x_{1,2}} + B_{1,2m} e^{-i\alpha_m x_{1,2}}) \sqrt{\frac{2}{d}} \sin\left(\frac{m\pi y_{1,2}}{d}\right), \quad (4)$$

where the subscript numerals 1 and 2 specify the regions representing regions W1 and W2, respectively. The wavefunction within the bend junction region J is chosen to be a sum of solutions of equation (1) that satisfy continuity of the wavefunction across the region boundaries 13

$$\Psi_J(x, y) = -\sum_{m=0}^{\infty} \sqrt{\frac{2}{d}} \sin\left(\frac{m\pi y}{d}\right) \frac{\sin(\alpha_m(x-d))}{\sin(\alpha_m d)} (A_{1m} + B_{1m}) - \sum_{m=0}^{\infty} \sqrt{\frac{2}{d}} \sin\left(\frac{m\pi x}{d}\right) \frac{\sin(\alpha_m(y-d))}{\sin(\alpha_m d)} (A_{2m} + B_{2m}). \quad (5)$$

The connection formulas relating the wavefunction solutions in the two straight segments of the quantum wire bend are obtained by demanding continuity of the normal spatial derivatives across the boundaries 13 between each of the three regions $$-\frac{\partial \Psi_1}{\partial x_1}\bigg|_{x_1=0} = \frac{\partial \Psi_J}{\partial x}\bigg|_{x=0} \quad (6)$$

-continued $$-\frac{\partial \Psi_2}{\partial x_2}\bigg|_{x_2=0} = \frac{\partial \Psi_J}{\partial y}\bigg|_{y=0}. \quad (7)$$

Performing the derivatives and projecting out the component transverse modes gives the desired linear relationships between the coefficients of the expansions for the two straight regions W1, W2

$$i\alpha_n d(A_{1n} - B_{1n}) = \alpha_n d\cot(\alpha_n d)(A_{1n} + B_{1n}) + \quad (8)$$
$$\sum_{m=0}^{\infty} \frac{2nm\pi^2}{(\alpha_m d)^2 - (n\pi)^2}(A_{2m} + B_{2m})$$

$$i\alpha_n d(A_{2n} - B_{2n}) = \alpha_n d\cot(\alpha_n d)(A_{2n} + B_{2n}) + \quad (9)$$
$$\sum_{m=0}^{\infty} \frac{2nm\pi^2}{(\alpha_m d)^2 - (n\pi)^2}(A_{1m} + B_{1m}).$$

Figure 6:
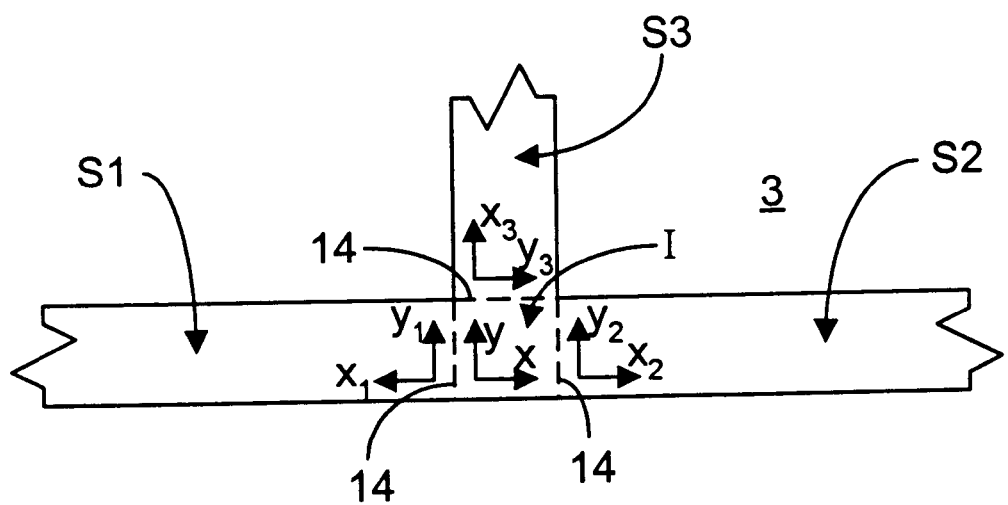
FIG. 6 is similar to FIG. 1C showing partitioning of the quantum wire junction into four distinct physical regions for mode matching purposes.

For analysis purposes, the quantum wire junction 3 can be broken up into four distinct regions as shown in FIG. 6. The four regions include three straight wire segments S1, S2 and S3 and an intersection region 1 that connects the three straight wire segments. The three straight wire segments S1, S2 and S3 have wavefunction solutions given by $$\Psi_i(x_i, y_i) = \sum_{m=0}^{\infty} (A_{im}e^{i\alpha_m x_i} + B_{im}e^{-i\alpha_m x_i})\sqrt{\frac{2}{d}}\sin\left(\frac{m\pi y_i}{d}\right) \quad (10)$$

where the index i specifies the region and runs from 1 to 3 representing regions S1, S2, and S3 respectively. The wavefunction within the intersection region I of the junction is chosen to be a sum of solutions of equation (1) that satisfy continuity of the wavefunction across the region boundaries 14

$$\Psi_J(x, y) = \sum_{m=0}^{\infty} \sqrt{\frac{2}{d}} \sin\left(\frac{m\pi y}{d}\right)\left(\frac{\sin(\alpha_m x)}{\sin(\alpha_m d)}(A_{2m} + B_{2m}) - \right. \quad (11)$$
$$\left. \frac{\sin(\alpha_m(x-d))}{\sin(\alpha_m d)}(A_{1m} + B_{1m})\right) +$$
$$\sum_{m=0}^{\infty} \sqrt{\frac{2}{d}} \sin\left(\frac{m\pi x}{d}\right)\frac{\sin(\alpha_m y)}{\sin(\alpha_m d)}(A_{3m} + B_{3m}).$$

The connection formulas relating the wavefunction solutions in the three straight segments S1, S2 and S3 of the quantum wire junction are obtained by demanding continuity of the normal spatial derivatives across each of the boundaries 14 between the four regions S1, S2, S3 and I $$\frac{\partial \Psi_1}{\partial x_1}\bigg|_{x_1=0} = -\frac{\partial \Psi_J}{\partial x}\bigg|_{x=0} \quad (12)$$

$$\frac{\partial \Psi_2}{\partial x_2}\bigg|_{x_2=0} = \frac{\partial \Psi_J}{\partial x}\bigg|_{x=d} \quad (13)$$

$$\frac{\partial \Psi_3}{\partial x_3}\bigg|_{x_3=0} = \frac{\partial \Psi_J}{\partial y}\bigg|_{y=d}. \quad (14)$$

Performing the derivatives and projecting out the component transverse modes gives the desired linear relationships between the coefficients of the expansions for the quantum straight wire regions S1, S2 and S3

$$i\alpha_n d(A_{1n} - B_{1n}) = \alpha_n d\cot(\alpha_n d)(A_{1n} + B_{1n}) - \quad (15)$$
$$\frac{(\alpha_n d)}{\sin(\alpha_n d)}(A_{2n} + B_{2n}) -$$
$$\sum_{m=0}^{\infty} \frac{2nm\pi^2}{(\alpha_m d)^2 - (n\pi)^2}(-1)^n(A_{3m} + B_{3m})$$

$$i\alpha_n d(A_{2n} - B_{2n}) = \alpha_n d\cot(\alpha_n d)(A_{2n} + B_{2n}) - \quad (16)$$
$$\frac{(\alpha_n d)}{\sin(\alpha_n d)}(A_{1n} + B_{1n}) +$$
$$\sum_{m=0}^{\infty} \frac{2nm\pi^2}{(\alpha_m d)^2 - (n\pi)^2}(-1)^{n+m}(A_{3m} + B_{3m})$$

and $$i\alpha_n d(A_{3n} - B_{3n}) = \alpha_n d\cot(\alpha_n d)(A_{3n} + B_{3n}) + \quad (17)$$
$$\sum_{m=0}^{\infty} \frac{2nm\pi^2}{(\alpha_m d)^2 - (n\pi)^2}(-1)^m((-1)^n(A_{2m} +$$
$$B_{2m}) - (A_{1m} + B_{1m}))$$

The electron stub tuner 4 can also be broken up into four distinct regions S1, S2, S3 and I in the same way as described above and shown in FIG. 6 for the quantum wire junction. One of the quantum straight wire regions S3, however, is terminated at an effective length L. The connection formulas relating the wavefunction solutions in the three straight segments S1, S2 and S3 are again given by equations (15–17), with the added boundary condition that the wavefunction in the third branch goes to zero when $x_3 = L$ $$A_{3n}e^{i\alpha_n L} + B_{3n}e^{-i\alpha_n L} = 0. \quad (18)$$

Figure 7:
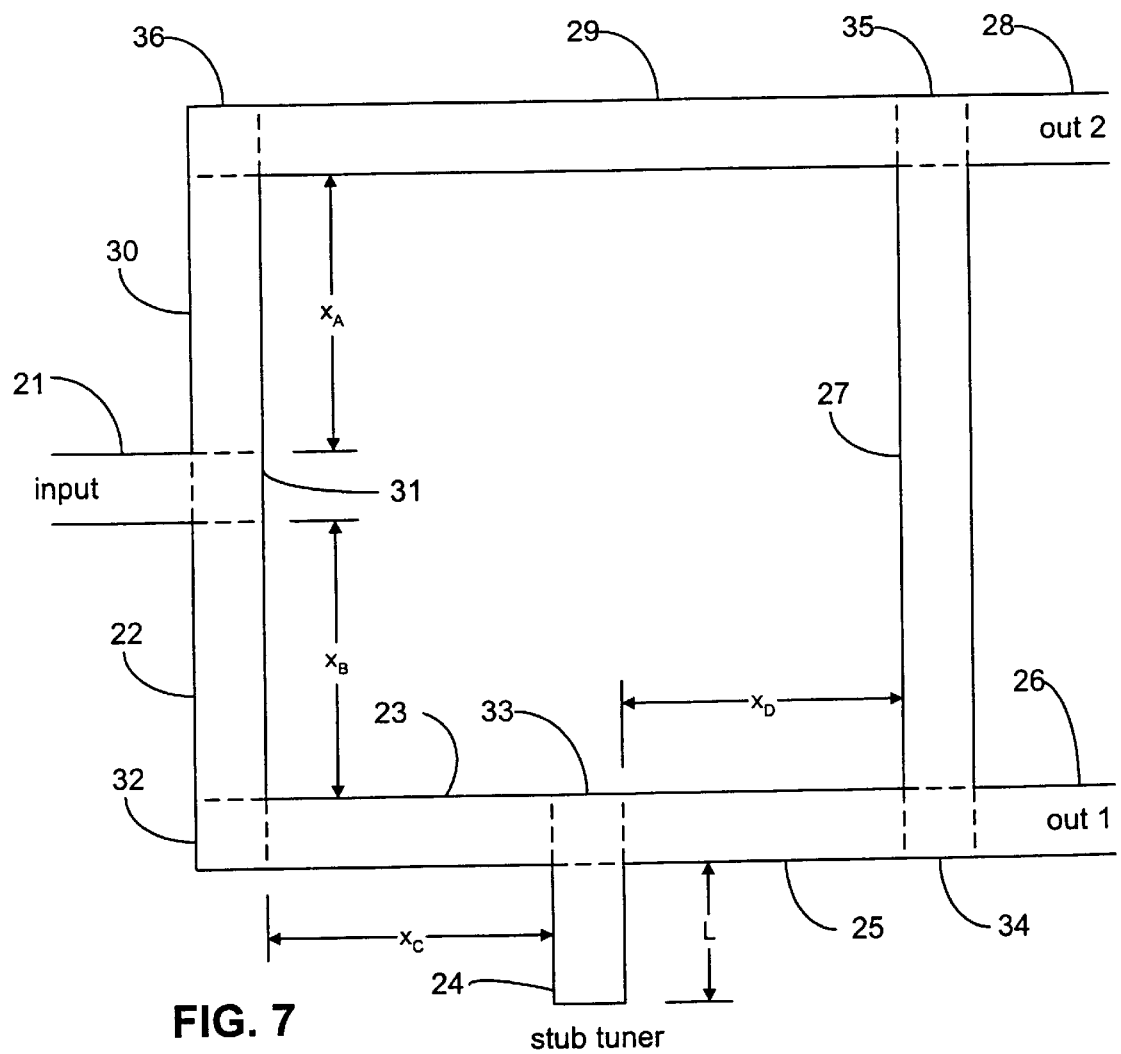
FIG. 7 is similar to FIG. 2 showing decomposition of the quantum wire switch structure into ten straight wire segments and six junction regions.

The above connection formulas, relating coefficients of the normal mode expansions of the quantum wavefunction for straight segments of quantum wire, can be applied to the topology of a quantum switch 5 described above. In FIG. 7 the structure of a quantum switch 5 is decomposed into ten constituent quantum wire segments 21–30 connected by six junction regions 31–36. The geometry is specified by the effective length of the stub tuner, L, and four independent length parameters, $x_A$, $x_B$, $x_C$, and $x_D$ that define the length of four quantum straight wire segments 30, 22, 23, and 25, respectively. All dimensions are specified in units of the wire width, d. It should be noted that in the ten constituent quantum wire segments 21–30 are represented in the following equations by subscript numerals 1 through 10 respectively.

To find the actual solution for the quantum wavefunction of a given geometry, the infinite sums over normal modes of the wire segments must be truncated to a finite number, N. Solution of the problem is then reduced to a matrix equation for the 20 N expansion coefficients. The matrix elements are supplied by the connection formulas, previously described, and the external boundary or input conditions. These conditions specify that there is a single-mode lowest energy state incident on the input line 21

$$B_{1n} = \begin{cases} 1 & n = 1 \\ 0 & n > 1 \end{cases} \quad (19)$$

and no states incident from either output line 26, 28

$$B_{6n} = B_{8n} = 0 \quad (20)$$

After specification of the energy of the incident mode, these conditions allow a complete solution of the wavefunction for a quantum switch structure 5 illustrated in FIG. 7. This solution can be viewed as a determination of the scattering problem from the input 21 to the two output lines 26 and 28. This result can be directly related to the conductance between input node 31 and the output nodes 34 and 35 using the fact that the square of the scattering amplitude is proportional to the internode conductance, with the constant of proportionality equal to $2e^2\hbar$.

Using the above equations, the length parameters giving the greatest switching efficiency for the single electron stub tuner embodiment of a quantum switch 5 can be calculated. With a mode energy of 1.5 times the energy of the cutoff of the lowest propagating mode, the most efficient switching was achieved using the following length parameters: $x_A = 1.025 \lambda_0$, $x_B = 1.050 \lambda_0$, $x_C = 1.100 \lambda_0$, and $x_D = 0.825 \lambda_0$, where $\lambda_0$ is the carrier wavelength along the propagation direction.

Figure 8:
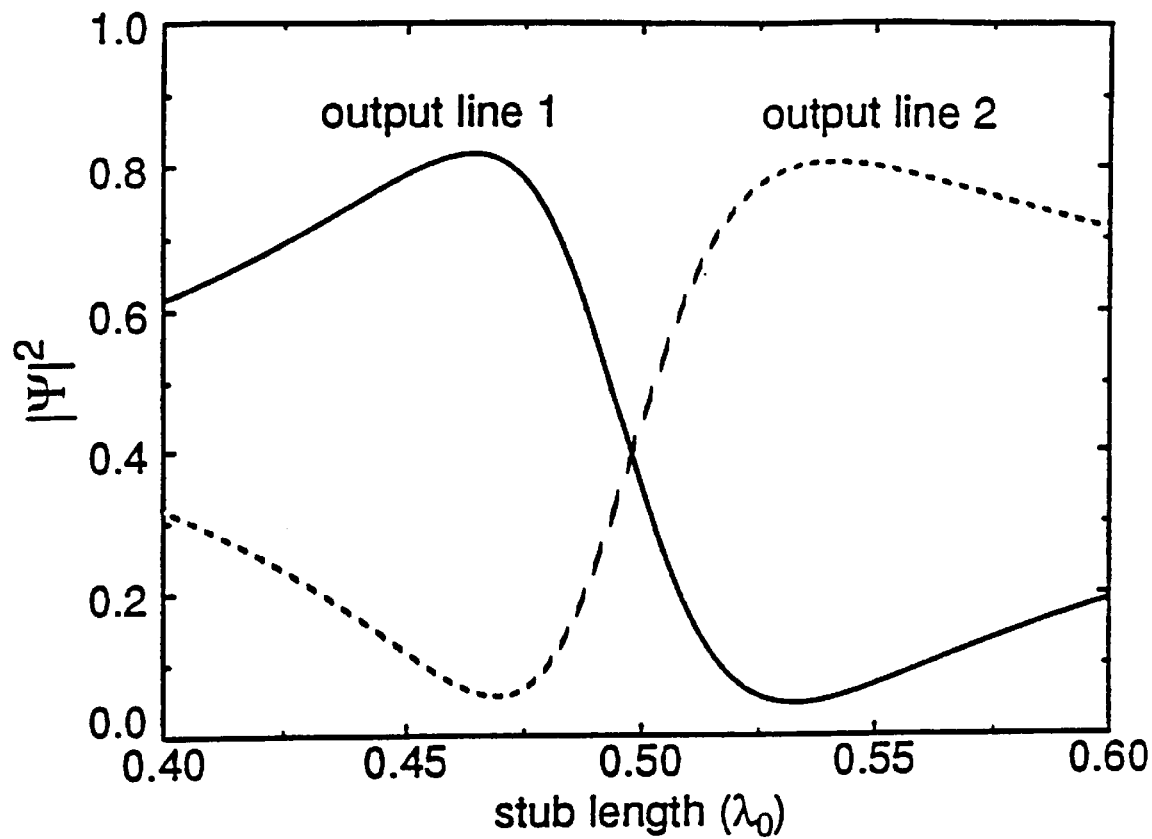
FIG. 8 is a graph depicting the scattering probability to each of the two outputs as a function of stub length for the optimum geometry of the single stub quantum switch.

FIG. 8 shows a plot of the scattering probability to each of the two output lines as a function of effective stub length for this optimum geometry. The solid line is a plot of the square of the magnitude of the coefficient of the normalized outgoing propagating mode on the first output line. This line peaks to a value of about $0.82|\Psi|^2$ at an effective stub length of approximately $0.47 \lambda_0$, where $\lambda_0$ is the carrier wavelength along the propagation direction, and reaches a low of about $0.06|\Psi|^2$ at an effective stub length of approximately $0.53 \lambda_0$. The dashed line is a plot of the analogous quantity for the second output line. This line reaches a low of about $0.06|\Psi|^2$ at an effective stub length of approximately $0.47 \lambda_0$ and peaks at about $0.82|\Psi|^2$ at an effective stub length of approximately $0.53 \lambda_0$. Thus, for the single electron stub tuner embodiment of a quantum switch, the conductance from the input line to the output lines has a switching characteristic of better than 10:1. This indicates that this embodiment has the desired property of efficiently switching an effective electrical connection from one circuit branch to another by changing the effective length of the component stub tuner.

Figure 9:
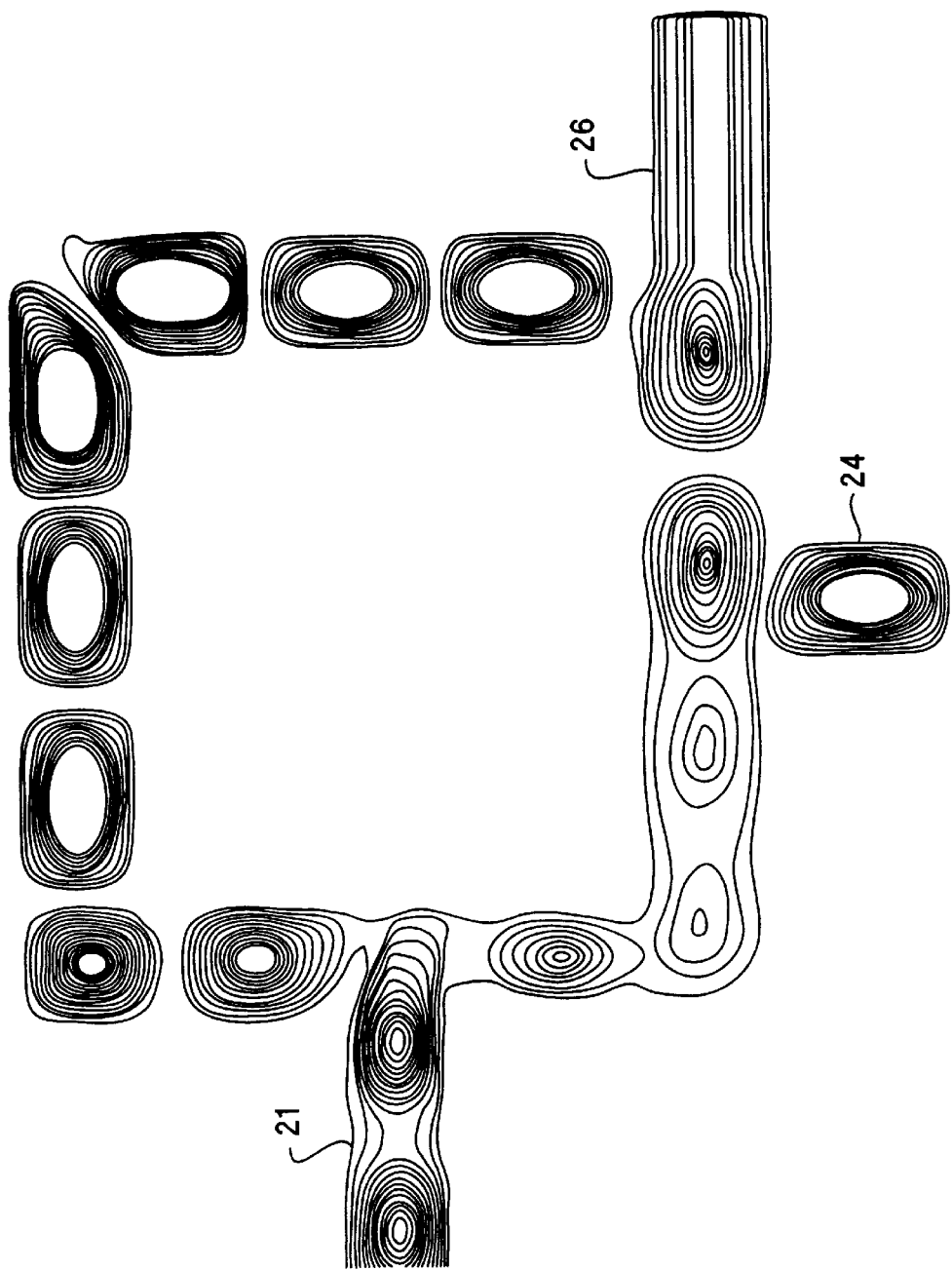
FIG. 9 is a contour plot of the magnitude of the quantum wavefunction over the single stub quantum switch geometry for a stub length corresponding to output 1 turned on and output 2 turned off.

FIG. 9 is a contour plot of the magnitude of the quantum wavefunctions corresponding to the peak of the curve for the first output line shown in FIG. 8. The plot illustrates the large transmission probability from the input line 21 to the first output line 26 as well as the minimal transmission probability from the input line to output line 2.

Figure 10:
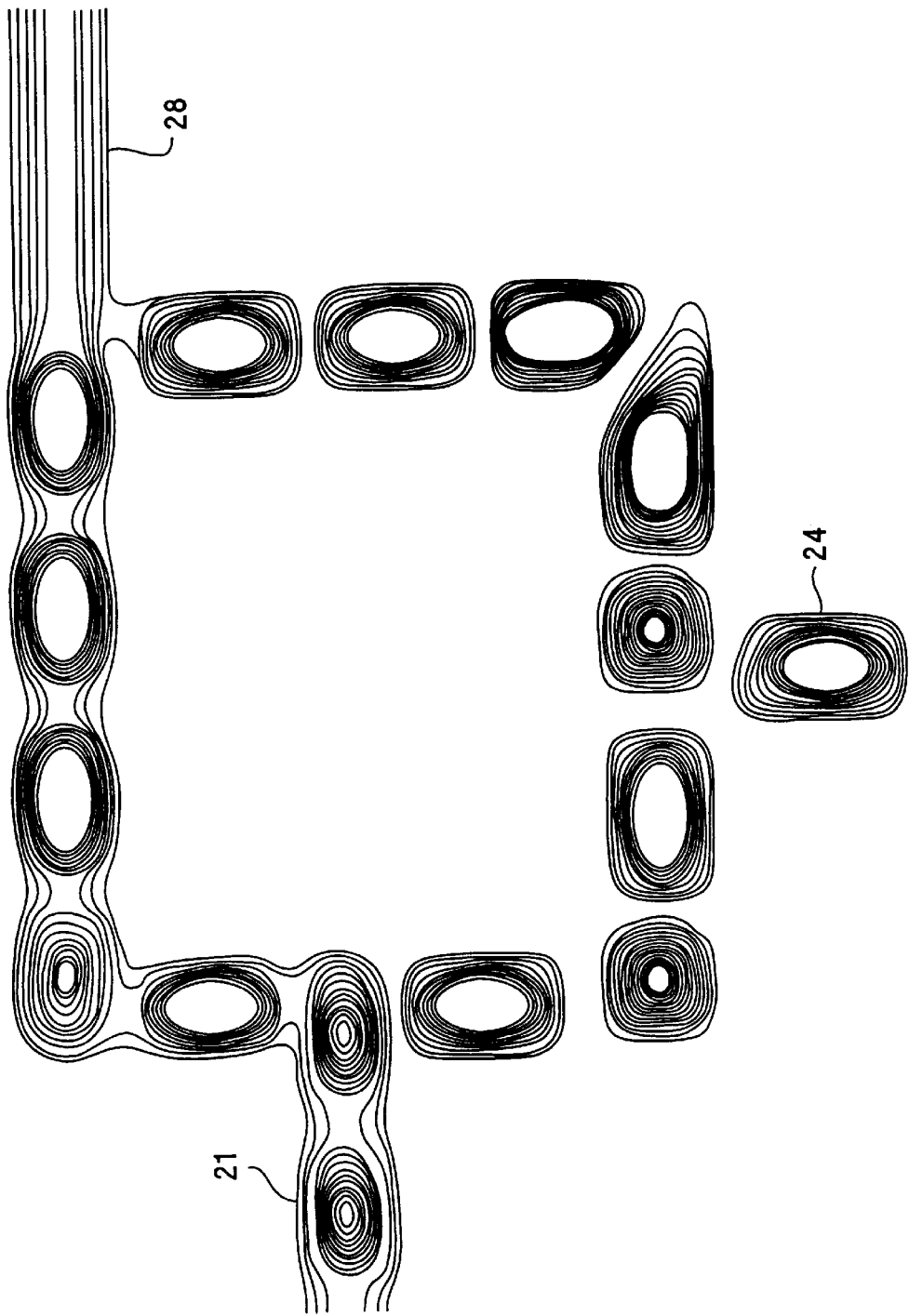
FIG. 10 is a contour plot of the magnitude of the quantum wavefunction over the single stub quantum switch geometry for a stub length corresponding to output 2 turned on and output 1 turned off.

FIG. 10 is a contour plot of the magnitude of the quantum wavefunction corresponding to the peak of the curve for the output line 2 shown in FIG. 8. A large transmission probability from the input line 21 to the second output line 28 as well as the minimal transmission probability from the input line to the first output line are illustrated.

It should be noted that the length parameters which give the above described optimized results will change with changes in carrier energies. This is a manifestation of the fact that the principle behind the operation of a quantum switch is wavefunction interference. If the energy of the carriers is changed, the de Broglie wavelength is also changed, requiring different structural dimensions to achieve the same interference mechanism. This also highlights the fact that a quantum switch of this sort is only operational for relatively monoenergetic carriers, and requires that the carrier energies must be below that of the first transverse mode excitation to ensure primarily single-wavelength operation.

Figure 11:
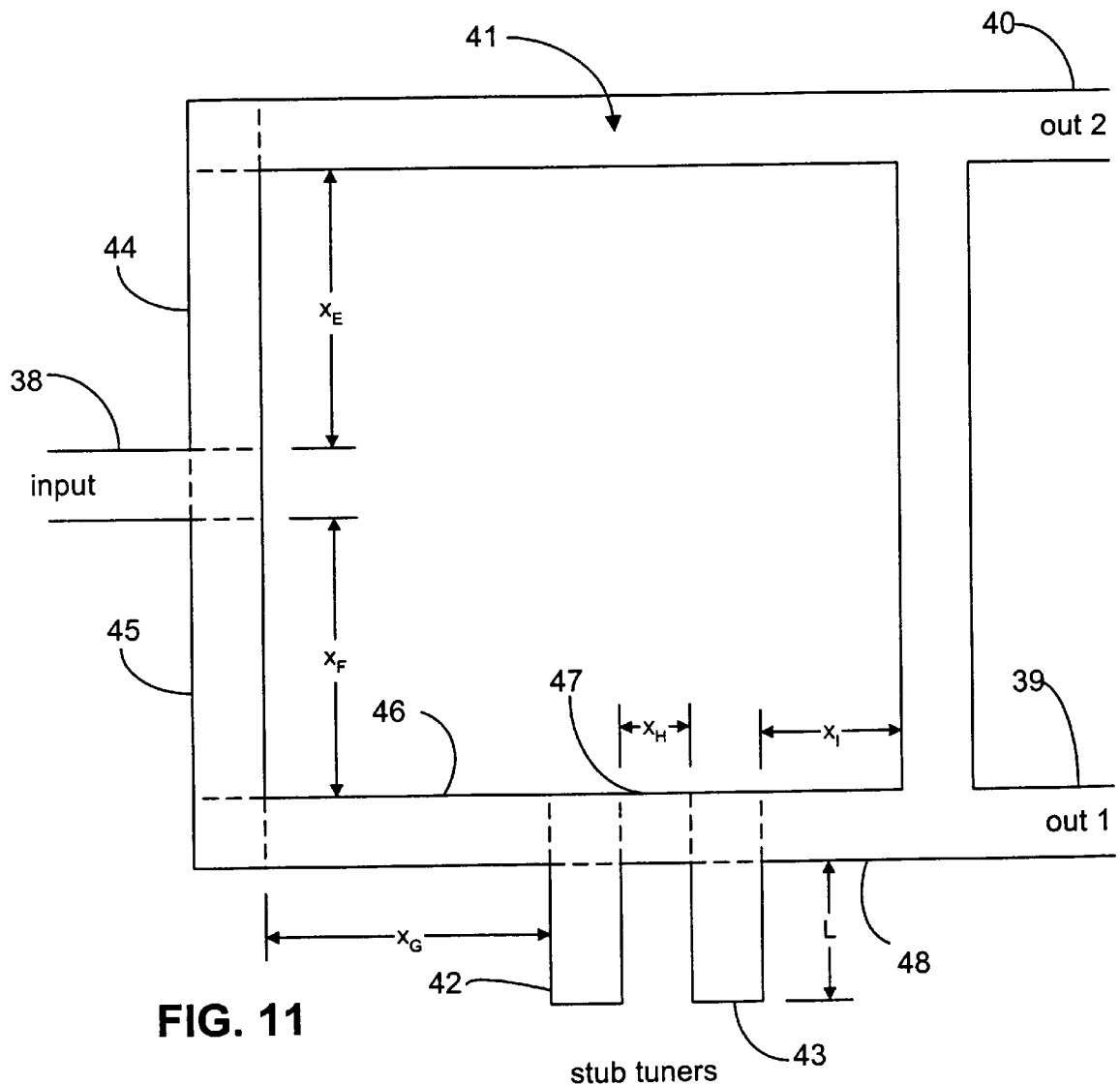
FIG. 11 is a schematic view depicting the structural topology of a double stub quantum switch according to the invention.

A second preferred embodiment of a quantum switch 37 according to the invention is depicted in FIG. 11. The switch consists of an input quantum wire 38 connected to a pair of output quantum wires 39, 40 by a quantum wire ring 41, with a first electron stub tuner 42 attached on a segment of the ring, and a second electron stub tuner 43 attached on a segment of the ring. The second electron stub tuner can be placed at any point on the ring, but it is preferably adjacent to the first electron stub tuner and of the same effective length as the first electron stub tuner. The second electron stub tuner can also be driven by a second control voltage distinct from the first control voltage, but it is preferable that a single control voltage (not shown) controls both stub tuners.

The geometry of the two electron stub tuner quantum switch 37 can be specified using the length of the two stub tuners, L, and the five independent length parameters, $x_E$, $x_F$, $x_G$, $x_H$ and $x_I$ that define the length of five quantum straight wire segments 44, 45, 46, 47 and 48, respectively. All dimensions are specified in units of the wire width, d.

The foregoing equations can be used to calculate the length parameters giving the greatest switching efficiency for the double electron stub tuner quantum switch 37 in much the same way as they were calculated for the single electron stub tuner quantum switch 5. With a mode energy of 1.5 times the energy of the cut off of the lowest propagating mode, the most efficient switching is achieved using the following length parameters: $x_E = 0.400 \lambda_0$, $x_F = 0.700 \lambda_0$, $x_G = 1.025 \lambda_0$, $x_H = 1.050 \lambda_0$ and $x_I = 0.200 \lambda_0$, where $\lambda_0$ is the carrier wavelength along the propagation direction.

Figure 12:
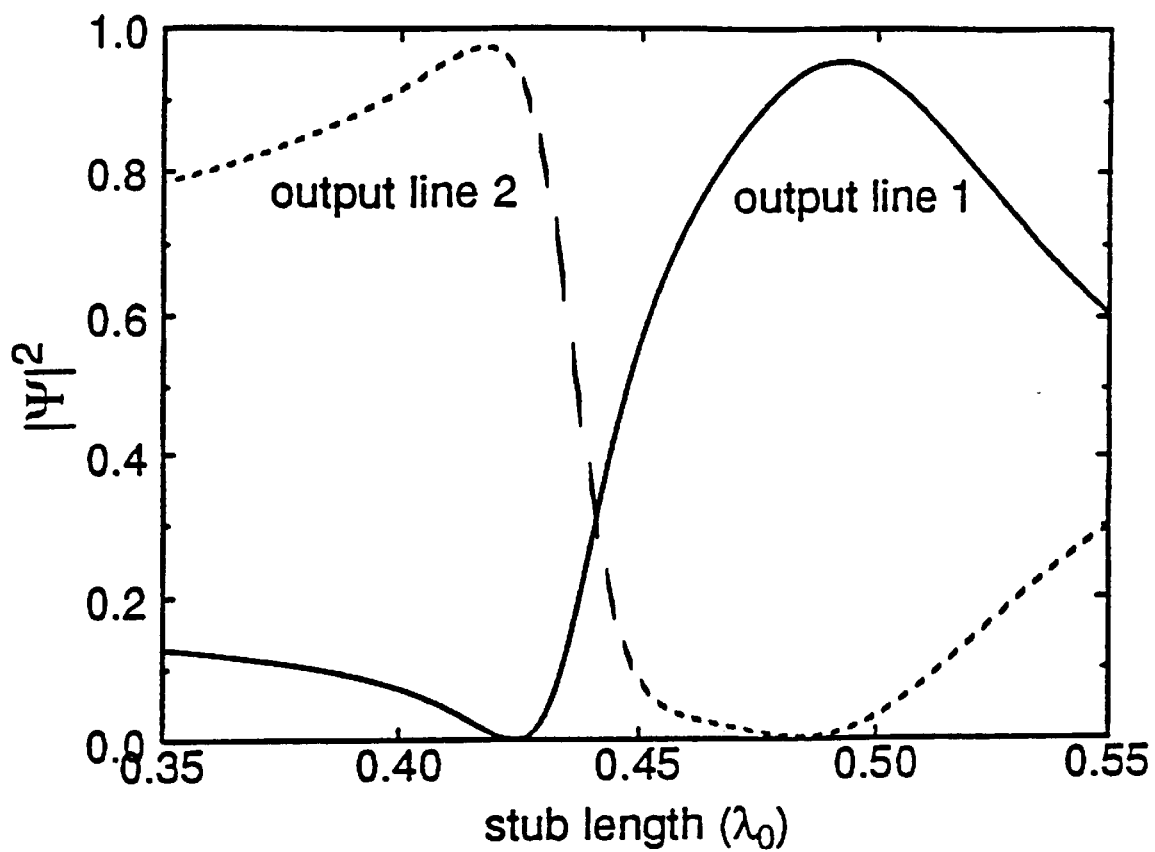
FIG. 12 is a graph depicting the scattering probability to each of the two outputs as a function of stub length for the optimum geometry of the double stub quantum switch.

FIG. 12 shows a plot of the scattering probability to each of the two output lines as a function of effective stub length for this optimum geometry. The solid line is a plot of the square of the magnitude of the coefficient of the normalized outgoing propagating mode on the first output line. This line reaches a low of about $0.00|\Psi|^2$ at an effective stub length of approximately $0.42 \lambda_0$, where $\lambda_0$ is the carrier wavelength along the propagation direction, and reaches a peak of about $0.95|\Psi|^2$ at an effective stub length of approximately $0.48 \lambda_0$. The dashed line is a plot of the analogous quantity for the second output line. This line reaches a peak of about $0.95|\Psi|^2$ at an effective stub length of approximately $0.42 \lambda_0$ and hits a low of about $0.00 |\Psi|^2$ at an effective stub length of approximately $0.48 \lambda_0$. Thus, for the double electron stub tuner quantum switch 37, the efficiency of the scattering probability from the input line to the output lines has increased over that of the single electron stub tuner quantum switch 5 from the maximum of roughly 80% to a maximum of over 95%.

Figure 13:
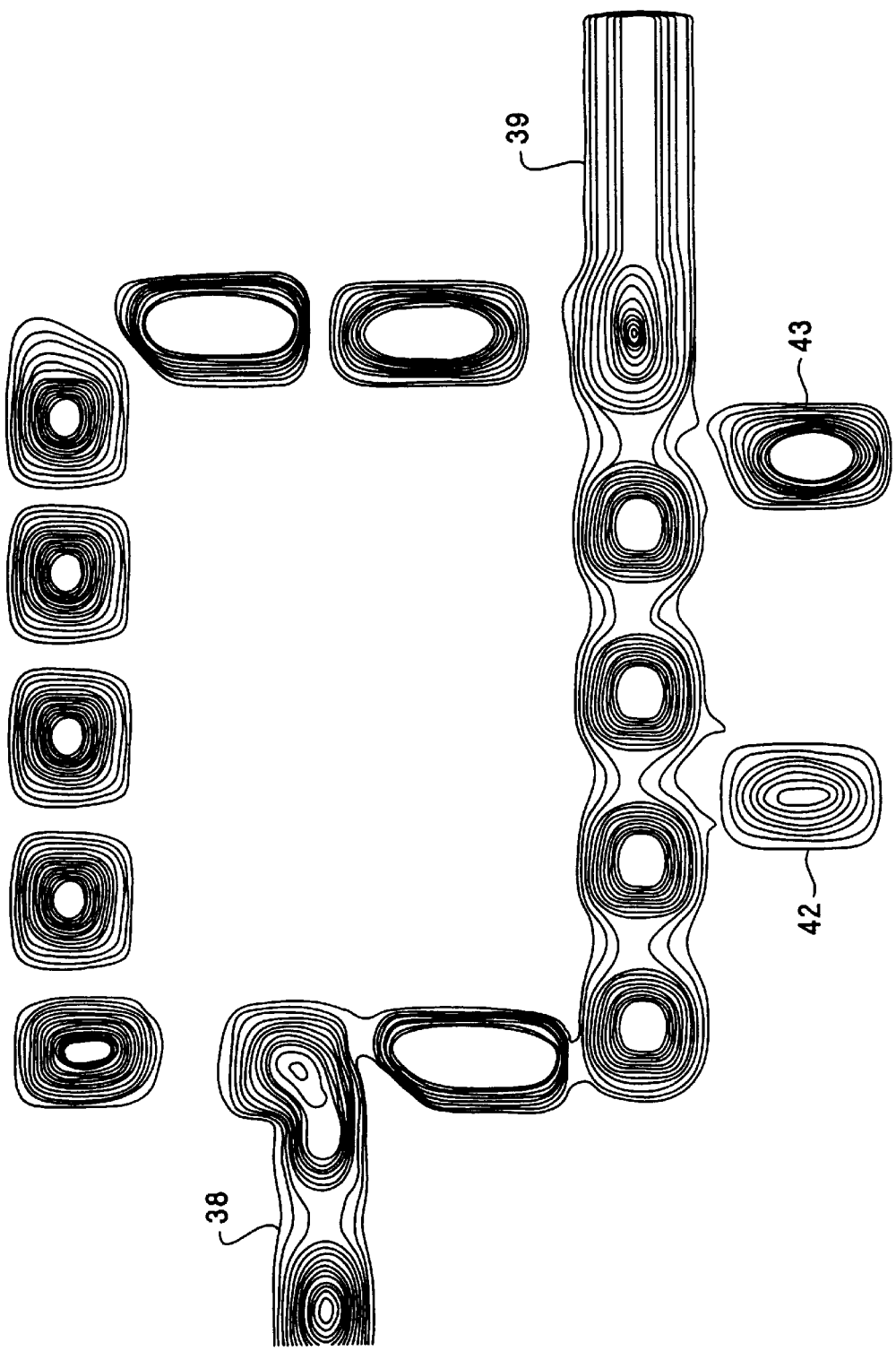
FIG. 13 is a contour plot of the magnitude of the quantum wavefunction over the double stub quantum switch geometry for stub lengths corresponding to output 1 turned on and output 2 turned off

FIG. 13 is a contour plot of the magnitude of the quantum wavefunctions corresponding to the peak of the curve for the first output line shown in FIG. 12. The plot illustrates the large transmission probability from the input line 38 to the first output line 39 as well as the minimal transmission probability from the input line to the second output line.

Figure 14:
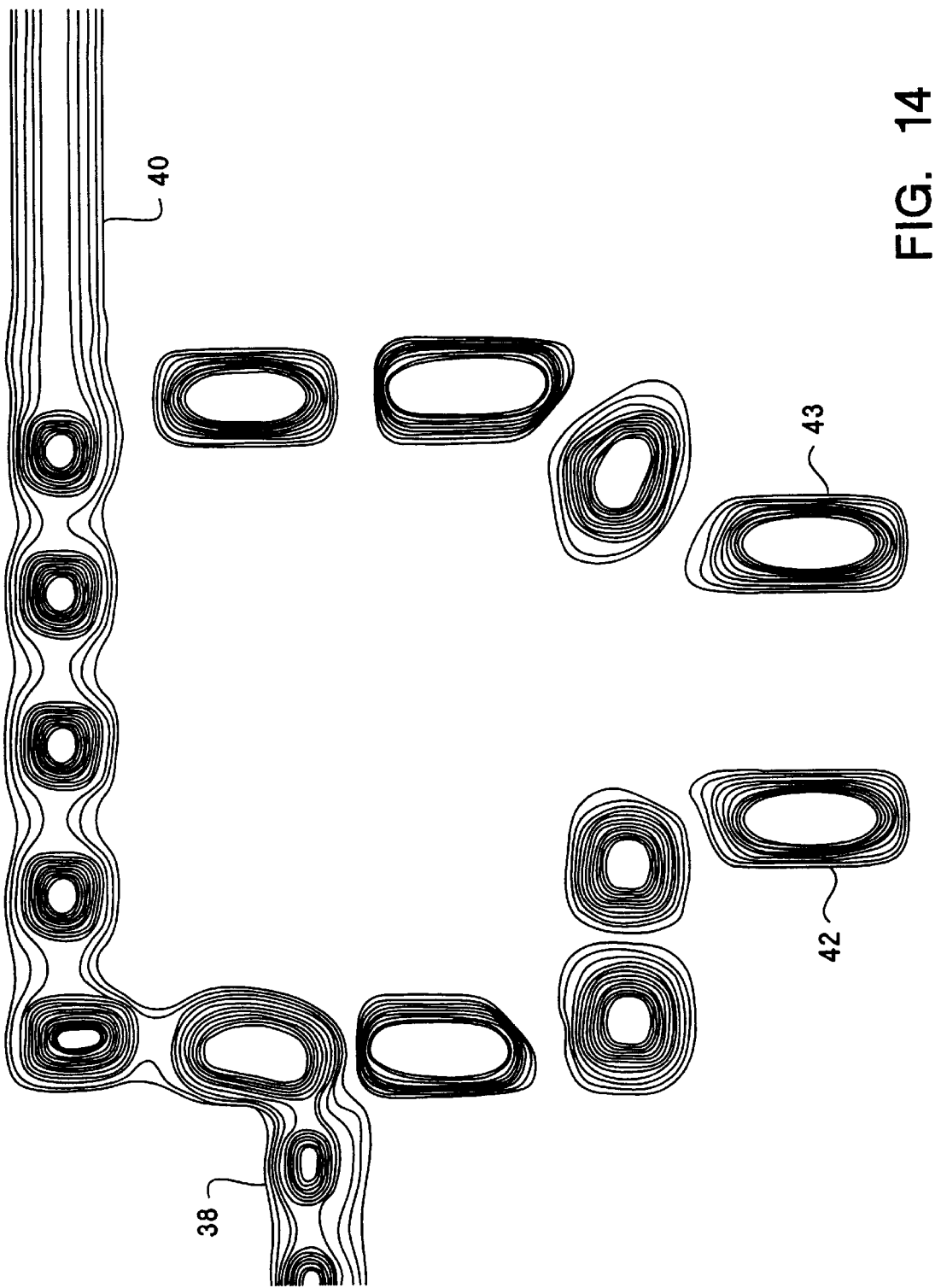
FIG. 14 is a contour plot of the magnitude of the quantum wavefunction over the double stub quantum switch geometry for stub lengths corresponding to output 2 turned on and output 1 turned off.

FIG. 14 is a contour plot of the magnitude of the quantum wavefunction corresponding to the peak of the curve for the second output line shown in FIG. 12. A large transmission probability from the input 38 to the second output line 40 as well as the minimal transmission probability from the input line to the first output line are illustrated.

Using the structure of the single electron stub tuner quantum switch 5, shown in FIG. 2, a simple binary NOT logic gate can be implemented. This is accomplished by applying a fixed input of electrical charge carriers to the input 6 of the switch and structuring the control of the electron stub tuner 10 such that a logical ZERO sets the effective length of the stub to the first length and a logical ONE sets it to the second length. Taking the output from one of the output lines 7, 8 with the sense that the presence of the electrical charge carriers is a logical ONE results in a logical ONE output when a logical ZERO is applied to control the stub, and vice versa.

For example, a logical ZERO input can be defined as a control condition that sets the effective stub length to approximately 0.47 $\lambda_0$ where $\lambda_0$ is the carrier wavelength along the propagation direction. A logical ONE input can similarly be defined as a control condition that sets the effective stub length to approximately 0.53 $\lambda_0$. For these settings, a logical ZERO input would provide a logical ONE output at the first output line 7, and a logical ONE input would provide a logical ZERO output at the first output line.

Alternatively, the structure of the double electron stub tuner quantum switch 37, shown in FIG. 11, can be implemented as a simple binary NOT logic gate. For example, a logical ZERO input can be defined as a control condition that sets the effective stub length to approximately 0.42 $\lambda_0$, where $\lambda_0$ is the carrier wavelength along the propagation direction. A logical ONE input can similarly be defined as a control condition that sets the effective stub length to approximately 0.48 $\lambda_0$. For these settings, a logical ZERO input would provide a logical ONE output at the second output line 40, and a logical ONE input would provide a logical ZERO output at the second output line.

Similarly, using the structure of the single electron stub tuner quantum switch 5, shown in FIG. 2, a simple binary AND logic gate can be implemented. This is accomplished by defining the application of a fixed input of electrical charge carriers to the input 6 of the switch as a first logical ONE, and the absence of the fixed input to the input of the switch as a first logical ZERO. In addition, the control of the electron stub tuner 10 is structured such that a second logical ZERO sets the effective length of the stub to the first length and a second logical ONE sets it to the second length. Taking the output from one of the output lines 7, 8 with the sense that the presence of the electrical charge carriers is a logical ONE results in a logical ONE output only when the first logical ONE is applied to the input 6 and the second logical ONE is applied to control the stub.

For example, a second logical ZERO input can be defined as a control condition that sets the effective stub length to approximately 0.47 $\lambda_0$, where $\lambda_0$ is the carrier wavelength along the propagation direction. A second logical ONE input can similarly be defined as a control condition that sets the effective stub length to approximately 0.53 $\lambda_0$. For these settings, a second logical ZERO input would provide a logical ZERO output at the first output line 7, whether or not a first logical ONE is applied to the input 6. A second logical ONE input would provide a logical ZERO output at the first output line 7 only if there is also a first logical ONE applied to the input.

Alternatively, the structure of the double electron stub tuner quantum switch 37, shown in FIG. 11, can be implemented as a simple binary AND logic gate. For example, a second logical ZERO input can be defined as a control condition that sets the effective stub length to approximately 0.42 $\lambda_0$, where $\lambda_0$ is the carrier wavelength along the propagation direction. A second logical ONE input can similarly be defined as a control condition that sets the effective stub length to approximately 0.48 $\lambda_0$. For these settings, a second logical ZERO input would provide a logical ZERO output at the second output line 40, whether or not a first logical ONE is applied to the input 38. A second logical ONE input would provide a logical ZERO output at the second output line 40 only if there is also a first logical ONE applied to the input 38.

The above described quantum switch according to the invention provides a smaller, faster, and electrically more efficient switch than the transistor switches in use today. These properties make the invention ideal for use in microprocessors and other integrated circuits and it may eventually replace the transistor, just as the transistor replaced vacuum tubes.

Although certain embodiments of the invention have been described and illustrated, the invention is not to be limited to the specific forms or arrangements of parts so described and illustrated. The invention is limited only by the claims.

We claim:

1. A logic gate comprising:

a bias port that receives a bias current of electric charge carriers having a range of characteristic de Broglie wavelengths;

an output port;

a first primary conductor extending from the bias port to the output port;

a second primary conductor extending from the bias port to a node;

a third primary conductor extending between the node and a point on the first primary conductor intermediate between the bias port and the output port;

a first stub conductor connected to one of the primary conductors, the first, second, and third primary conductors and the first stub conductor being conductive of electric charge carriers having a range of characteristic de Broglie wavelengths, each of said conductors having a transverse dimension of the same order of magnitude as the de Broglie wavelengths of the carriers; and a first input port coupled to the first stub conductor, the length of the first stub conductor being variable between a first length when an input signal having a first magnitude that characterizes a first logic level is applied to the first input port and a second length when an input signal having a magnitude that characterizes a second logic level is applied to the first input port, the bias current propagating from the bias port to the output port when an input signal having the first magnitude is applied to the first input port but not when an input signal having the second magnitude is applied to the first input port, absence of the bias current at the output port being indicative of the first logic level and presence of the bias current at the output port being indicative of the second logic level.

2. A logic gate as in claim 1 and further comprising:

a second stub conductor connected to one of the first, second, and third primary conductor, the second stub conductor:

being conductive of electric charge carriers having a range of characteristic de Broglie wavelengths, having a transverse dimension of the same order of magnitude as the de Broglie wavelengths of the carriers, coupled to the first input port, and having a length being variable between a third length when the input signal having the first magnitude that characterizes the first logic level is applied to the first input port and a fourth length when the input signal having the magnitude that characterizes the second logic level is applied to the first input port.

3. A logic gate as in claim 2 wherein:

the third length is approximately equal to the first length of the first stub conductor; and the fourth length is approximately equal to the second length of the first stub conductor.

4. A logic gate comprising:

a first input port variable between a first state and a second state, the first state including a first input current of electric charge carriers having a range of characteristic de Broglie wavelengths and characterizing a first logic level, the second state including a second input current different from the first input current and characterizing a second logic level;

an output port;

a first primary conductor extending from the input port to the output port;

a second primary conductor extending from the input port to a node;

a third primary conductor extending between the node and a point on the first primary conductor intermediate between the input port and the output port;

a first stub conductor connected to one of the primary conductors, the first, second, and third primary conductors and the first stub conductor being conductive of electric charge carriers having a range of characteristic de Broglie wavelengths, each of said conductors having a transverse dimension of the same order of magnitude as the de Broglie wavelengths of the carriers; and a second input port coupled to the first stub conductor, the length of the first stub conductor being variable between a first length when an input signal having a first magnitude that characterizes a first logic level is applied to the second input port and a second length when an input signal having a magnitude that characterizes a second logic level is applied to the second input port, the first input current propagating from the first input port to the output port when the first input port is in the first state and the input signal having the first magnitude is applied to the second input port, but the first input current not propagating from the first input port to the output port when one of:

the input signal having the second magnitude is applied to the second input port, and the first input port is in the second state, presence of the first input current at the output port being indicative of the first logic level and absence of the first input current at the output port being indicative of the second logic level.

5. A logic gate as in claim 4 and further comprising:

a second stub conductor connected to one of the first, second, and third primary conductor, the second stub conductor:

being conductive of electric charge carriers having a range of characteristic de Broglie wavelengths, having a transverse dimension of the same order of magnitude as the de Broglie wavelengths of the carriers, coupled to the second input port, and having a length being variable between a third length when the input signal having the first magnitude that characterizes the first logic level is applied to the second input port and a fourth length when the input signal having the magnitude that characterizes the second logic level is applied to the second input port.

6. A logic gate as in claim 5 wherein:

the third length is approximately equal to the first length of the first stub conductor; and the fourth length is approximately equal to the second length of the first stub conductor.

7. A logic gate as in claim 4 wherein the second input current has a magnitude of zero.

* * * * *